(12) United States Patent
Ishibashi

(10) Patent No.: US 6,589,880 B2
(45) Date of Patent: Jul. 8, 2003

(54) FINE PATTERN FORMATION METHOD AND SEMICONDUCTOR DEVICE OR LIQUID CRYSTAL DEVICE MANUFACTURING METHOD EMPLOYING THIS METHOD

(75) Inventor: Takeo Ishibashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 25 days.

(21) Appl. No.: 09/749,834

(22) Filed: Dec. 28, 2000

(65) Prior Publication Data

US 2002/0006730 A1 Jan. 17, 2002

(30) Foreign Application Priority Data

Jun. 22, 2000 (JP) .......................... 2000-188160

(51) Int. Cl.7 ....................... H01L 21/302; H01L 21/461
(52) U.S. Cl. ....................... 438/723; 438/735; 438/738; 430/316
(58) Field of Search ..................... 438/700, 706, 438/710, 720, 735, 738, 723; 430/316, 318; 216/48; 313/500; 428/698

(56) References Cited

U.S. PATENT DOCUMENTS

| | | | | | |
|---|---|---|---|---|---|
| 5,902,702 A | * | 5/1999 | Nakao et al. | ................ | 428/698 |
| 6,087,772 A | * | 7/2000 | Ootsuki et al. | ............. | 313/500 |
| 6,270,948 B1 | * | 8/2001 | Sato et al. | .................... | 216/49 |
| 6,306,560 B1 | * | 10/2001 | Wang et al. | ................. | 430/316 |
| 6,323,132 B1 | * | 11/2001 | Hwang et al. | .............. | 438/706 |

FOREIGN PATENT DOCUMENTS

| | | |
|---|---|---|
| JP | 5-326899 | 12/1993 |
| JP | 6-244156 | 9/1994 |
| JP | 6-291116 | 10/1994 |
| JP | 9-186166 | 7/1997 |

* cited by examiner

Primary Examiner—William David Coleman
(74) Attorney, Agent, or Firm—McDermott, Will & Emery

(57) ABSTRACT

There is provided a method of forming a fine pattern comprising the steps of: forming a work film to be processed on a substrate; forming a hard mask film which has a different etching rate from the work film and can serve as a mask to the work; forming a first resist pattern on the hard mask film by lithography; forming a hard mask pattern by etching a first section which is not covered with the first resist pattern till the upper surface of the work film is exposed; removing the first resist pattern; forming a second resist pattern on the hard mask pattern by lithography; etching a second section which is not covered with the second resist pattern by isotropic etching; removing the second resist pattern; and etching the work film through the hard mask pattern as a mask, partially subjected to the isotropic etching. This method enables to prevent the whole remaining patterns from shrinking even when fine patterns beyond the resolving power in lithography technologies are formed.

9 Claims, 8 Drawing Sheets

FIG.3
ST2-1 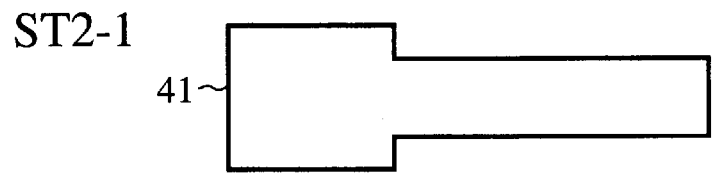
ST2-2 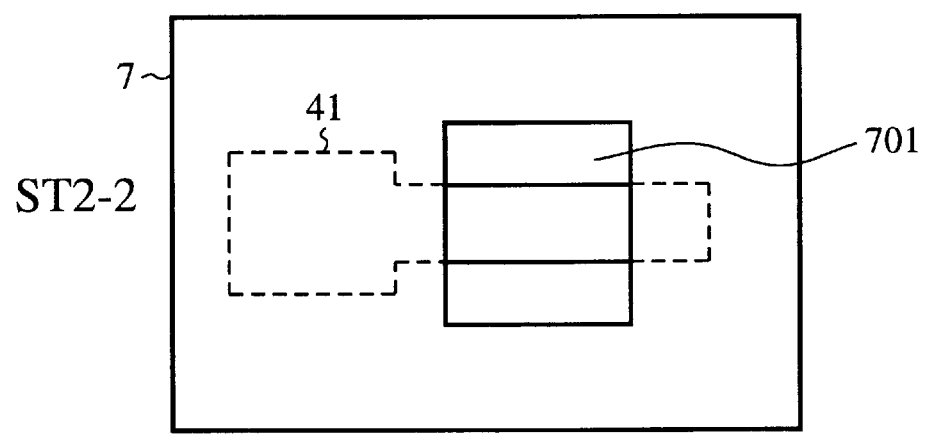
ST2-3 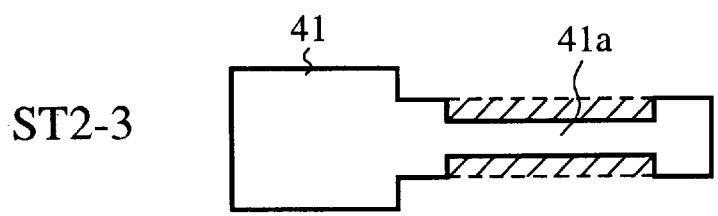
ST2-4 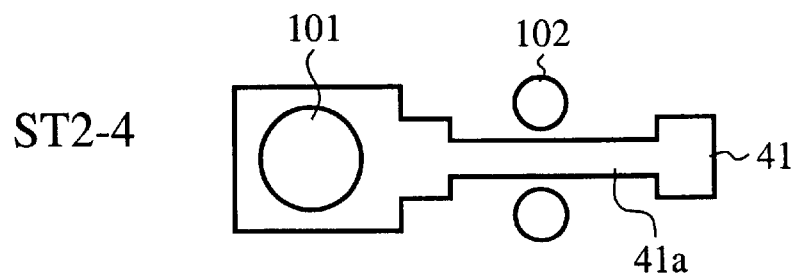

FIG.4
ST3-1
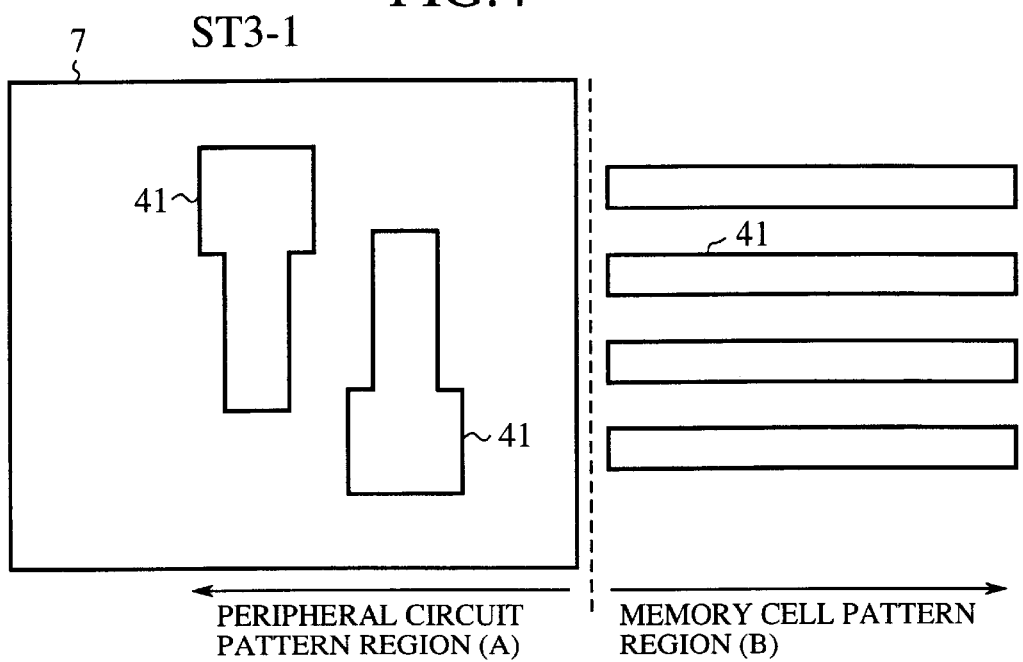
← PERIPHERAL CIRCUIT PATTERN REGION (A) → | ← MEMORY CELL PATTERN REGION (B) →
ST3-2
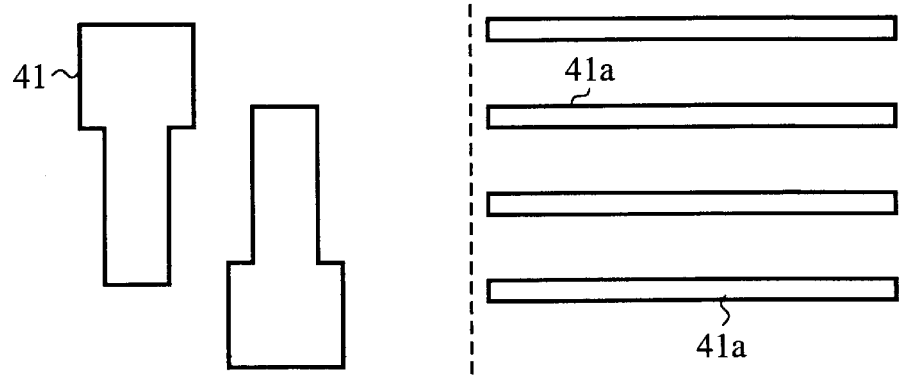
ST3-3
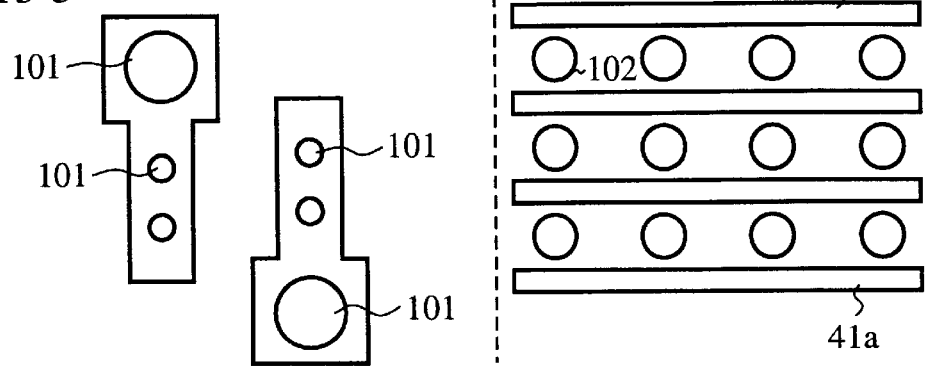

FINE PATTERN FORMATION METHOD AND SEMICONDUCTOR DEVICE OR LIQUID CRYSTAL DEVICE MANUFACTURING METHOD EMPLOYING THIS METHOD

BACKGROUND OF THE INVENTION

1. Field of the Invention

The present invention relates to a method of forming a fine pattern which should be applied to an electronics device such as semiconductor device and liquid crystal device, and relates to a device produced by this method.

2. Description of the Prior Art

FIG. 7 is a process flowchart illustrating a conventional method of forming a fine pattern. In FIG. 7, reference numeral 100 designates a substrate; and 300 designates a work film to be processed; 301 designates a process pattern; 600 designates a resist; and 601 designates a resist pattern.

The operation will be next described below.

The work film 300 such as a conductive film is formed on the substrate 100 (ST1001), the resist 600 is formed thereon by spin coating (ST1002), which is subjected to photolithography so as to obtain the resist pattern 601 (ST1003). Subsequently, the work film 300 is etched through the resist pattern 601 as a mask, thus having the process pattern 301 (ST1004), and finally the resist pattern 601 is removed by way of resist ashing, stripping, and so on, thus completing the formation of a desired fine pattern (ST1005).

FIG. 8 is a process flow chart illustrating another conventional method of forming a fine pattern. In FIG. 8, reference numeral 400 designates an etching mask film; 401 designates a processed etching mask film; and 401a designates a modified etching mask film, which serves as a hard mask to the work film 300. Note that the same reference numerals above denote the same components or corresponding parts and these explanations will be omitted.

The operation will be next described below.

The work film 300 such as a conductive film is formed on the (ST2001), the etching mask 400 is formed thereon, which has an etching rate different from the work film 300 and has a desired selectivity to it. The resist 600 is formed by spin coating (ST2002), which is subjected to photolithography, thus having the resist pattern 601 (ST2003). Subsequently, the etching mask film 400 is etched till the surface of the work film 300 of a negative pattern section is completely exposed through the resist pattern 601 as a mask, thus bringing the processed etching mask film 401 (ST2004).

After the resist pattern 601 is removed by way of resist ashing, stripping, and the like, a film of which the etch rate is different from the work film 300 to serve as a mask to the work film 300 during etching is subjected to an isotropic etching process unselectively, thus having the modified etching mask film 401a (ST2005), and then when the work film 300 is etched through the film 401a as a hard mask, the formation of a desired fine pattern is completed (ST2006).

The conventional methods of forming a fine pattern are configured as described above. In summary, one method is as follows: as shown in FIG. 7, the resist pattern 601 is formed on the work film 300, and etching is performed through the pattern 601 as a mask, thus forming the process pattern 301. Alternatively, another method is as follows: the work film 300 is etched through a film of which the etching rate is different from the work film 300 to serve as a mask to it during etching, thus forming the process pattern 301.

However, the process pattern 301 formed by these methods has a problem that a pattern formation beyond resolution by lithography technology is impossible.

Alternatively, as shown in FIG. 8, it is considered that with respect to the film of which the etch rate is different from the work film 300 to serve as a mask to it during etching, isotropic etching is unselectively performed for pattern processing, and the work film 300 is etched through the resultant pattern as a hard mask, having the process pattern 301. However, in this case, all the parts of the remaining patterns are shrunk, which may lead to difficulties on pattern designs.

SUMMARY OF THE INVENTION

The present invention is implemented to solve the foregoing drawbacks. It is therefor an object of the present invention to provide a method of forming a fine pattern that only line or left patterns to be required may be shrunk, resulting in a desired pattern on the designs, and a device manufactured by the above method.

According to a first aspect of the present invention, there is provided a method of forming a fine pattern comprising the steps of: forming a work film to be processed on a substrate; forming a hard mask film which has a different etching rate from the work film and can serve as a mask to the work film; forming a first resist pattern on the hard mask film by lithography; forming a hard mask pattern by etching a first section which is not covered with the first resist pattern till the upper surface of the work film is exposed; removing the first resist pattern; forming a second resist pattern on the hard mask pattern by lithography; etching a second section which is not covered with the second resist pattern by isotropic etching; removing the second resist pattern; and etching the work film through the hard mask pattern as a mask, partially subjected to the isotropic etching.

Here, the work film may be composed of a conductive film, while the hard mask film may be composed of a insulating film.

In addition, the conductive film may be composed of at least one type of polysilicon, tungsten silicide, aluminum, and tungsten, or a multi-layered film thereof, while the insulating film may be composed of either silicon oxide or silicon nitride, or a two-layered film thereof.

Alternatively, the work film may be composed of an insulating film, while the hard mask film is composed of a conductive film.

Further, the insulating film may be composed of either silicon oxide or silicon nitride, or a two-layered film thereof, while the conductive film may be composed of at least one type of polysilicon, tungsten silicide, aluminum, and tungsten, or a multi-layered film thereof.

In this case, the isotropic etching may be performed by wet etching.

Furthermore the aforementioned method may comprise a step of forming an antireflection film before the step of forming the first resist pattern.

According to a second aspect of the present invention, there is provided a method of manufacturing semiconductor device or liquid crystal device employing a method of forming a fine pattern comprising the steps of: forming a work film to be processed on a substrate; forming a hard mask film which has a different etching rate from the work film and served as a mask to the work film during etching; forming a first resist pattern on the hard mask film by lithography; forming a hard mask pattern by etching a first section which is not covered with the first resist pattern till the upper surface of the work film is exposed; removing the first resist pattern; forming a second resist pattern on the hard mask pattern by lithography; etching a second section which is not covered with the second resist pattern by isotropic etching; removing the second resist pattern; and etching the work film through the hard mask pattern partially subjected to the isotropic etching and serving as a mask.

BRIEF DESCRIPTION OF THE DRAWINGS

FIG. 3 is a plan view illustrating a process flow of a first specific example in accordance with the embodiment 1 of the present invention;

FIG. 4 is a plan view illustrating a process flow of a second specific example in accordance with the embodiment 1 of the present invention;

DETAILED DESCRIPTION OF THE PREFERRED EMBODIMENTS

An embodiment of the present invention will be described below.

Embodiment 1

Figure 1:
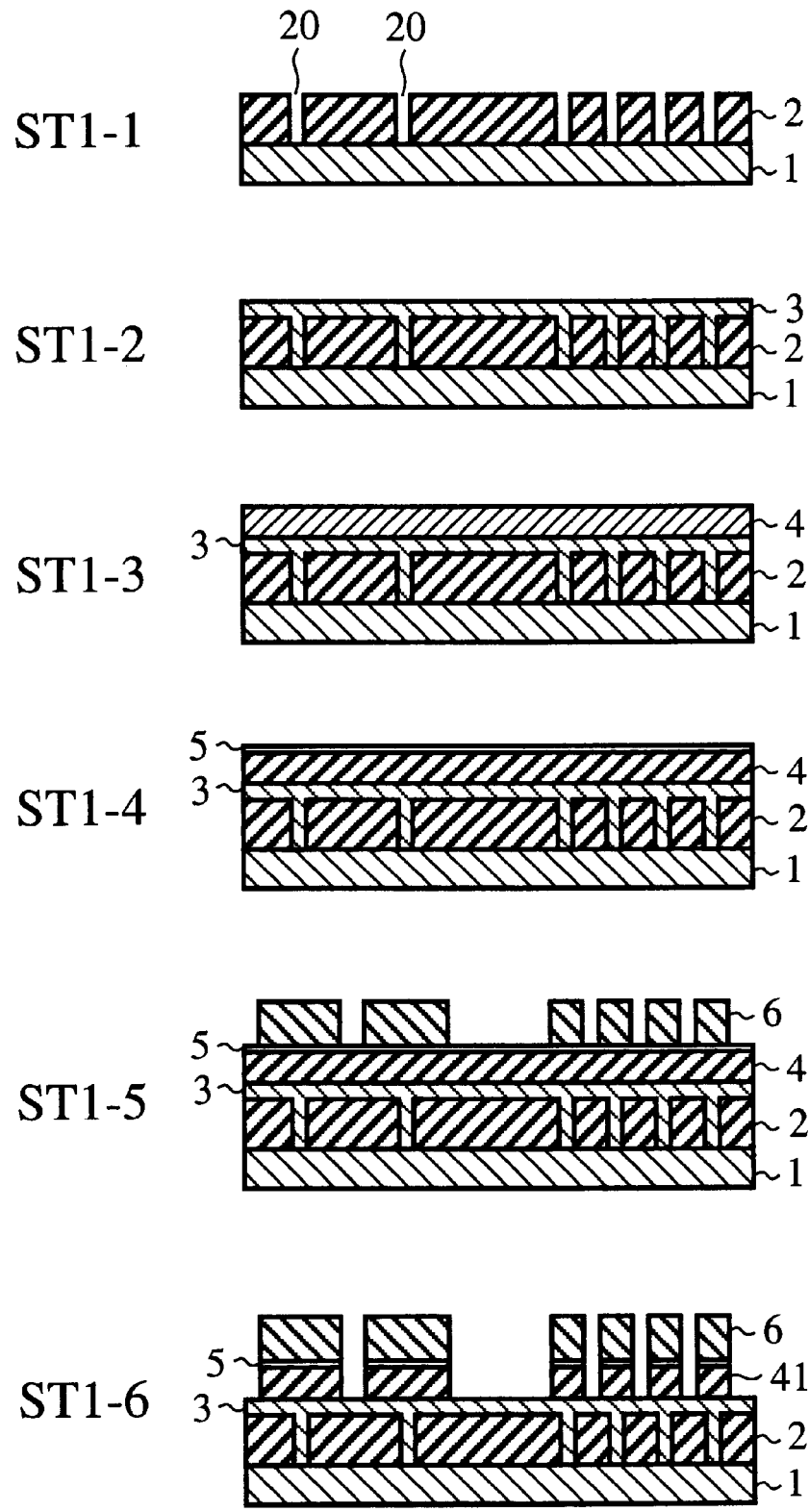
FIG. 1 is a process flow chart of a method of forming a fine pattern in accordance with an embodiment 1 of the present invention.
Figure 2:
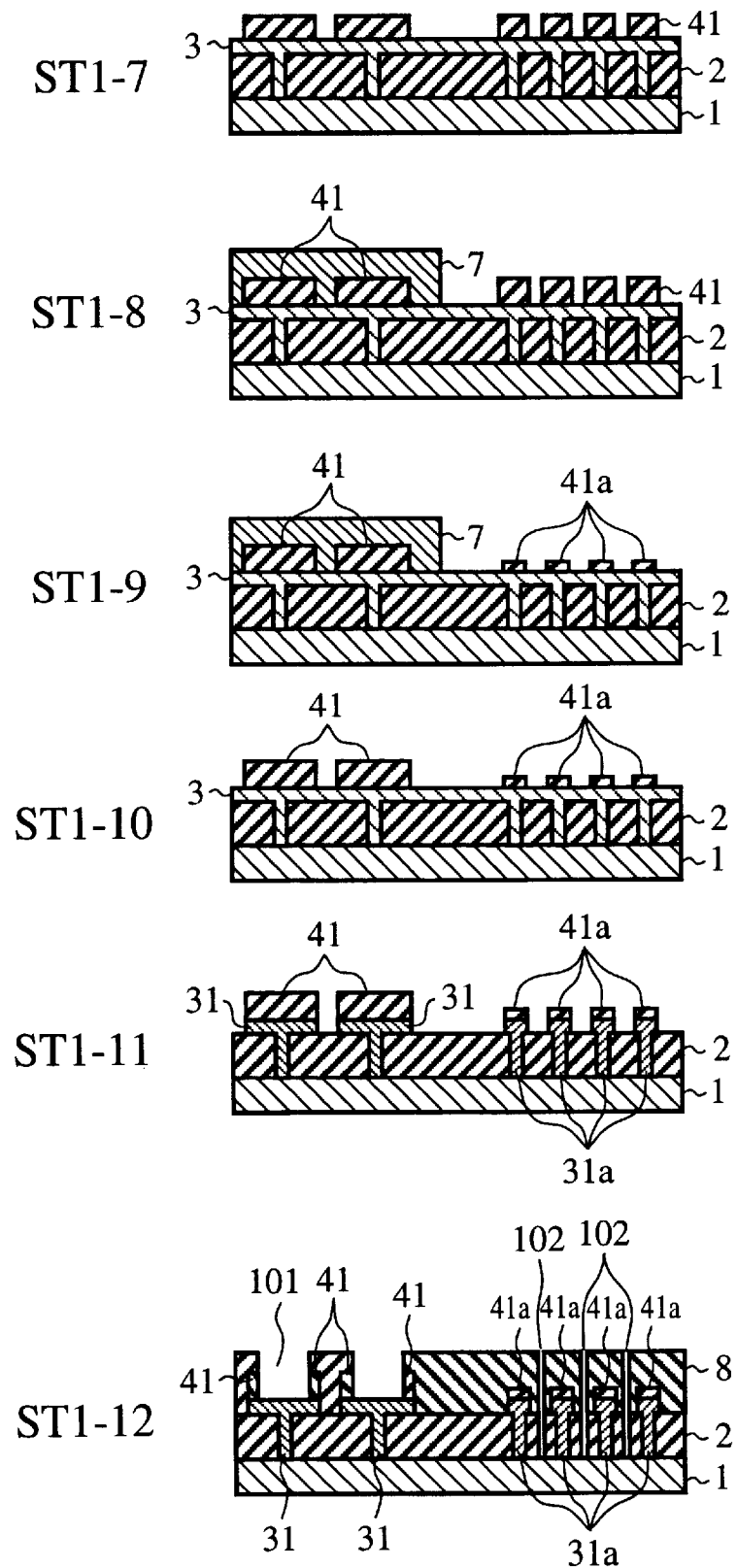
FIG. 2 is a process flow chart of a method of forming a fine pattern in accordance with an embodiment 1 of the present invention.

FIGS. 1 and 2 are a process flow chart of a method of forming a fine pattern in accordance with an embodiment 1 of the present invention, and this method is typically applied on the formation of wiring patterns during manufacturing processes of a semiconductor device or liquid crystal device.

In FIGS. 1 and 2, reference numeral 1 designates a substrate; 2 designates a first insulating layer; 3 designates a conductive film (work film) composed of at least one type of polysilicon, tungsten silicide, aluminum, and tungsten, or a multi-layered film of them; 4 designates an insulation mask (hard mask film) composed of either of silicon oxide and silicon nitride, or a two-layered film of them; 5 designated an organic antireflection film; 6 designates a first resist pattern; 7 designates a second resist pattern; 20 designates a contact hole; 41 designates an insulation mask pattern (hard mask pattern); 41a designates a modified insulation mask pattern section (hard mask pattern); 31 designates a wiring pattern; 31a designates an elongated wiring pattern; 8 designates a second insulating layer; and 101, 102 each designate a hole pattern.

The operation will be next described below.

First, the conductive film 3 is deposited with 350 nm thick by chemical vapor deposition or CVD on the first insulating layer 2 which is formed on the substrate 1 with the desired contact hole 20 (ST1-1, ST1-2). The insulation mask film 4 having a thickness of 100 nm is deposited thereon, and after coating a resist, it is featured into the first resist pattern 6 (ST1-3 to ST1-5) in accordance with the minimum line width in the Krypton-F (Kr—F) excimer laser lithography, that is, a line dimension of 180 nm and a space dimension of 180 nm, which falls within a resolution limitation in this lithography.

In this case, the antireflection film 5 having a thickness of 50–80 nm may be formed so as to improve lithography characteristics under the first resist pattern 6 (ST1-4 to ST1-6).

In addition, a pattern surpassing the resolving power of the above-mentioned excimer lithography is preferable on the designs. The fine wiring pattern formed by the excimer lithography is employed as a mask and the insulation mask film 4 is subjected to unisotropic etching till the conductive film 3 as a sub-layer is exposed, thus forming the insulation mask pattern 41 (ST1-6).

Thereafter, the resultant first resist pattern 6 and organic antireflection film 5 are removed by an ashing process such as O2 plasma, or a mixing solution of sulfuric acid and hydrogen peroxide (ST1-7). A desired second resist pattern 7 is formed thereon with 1000 nm thick using the G-line or I-line lithography of the halogen lamp (ST1-8).

The insulation mask pattern 41 composed of the insulation mask pattern is subjected to an isotropic etching process of 3 to 50 nm with a diluted hydrogen fluoride solution (0.5 percentage by weight or wt %), and the modified insulation mask pattern section 41a in which a wiring width of the silicon oxide is shrunk by 60 to 100 nm is formed for only a section which is not covered by the second resist pattern 7 (ST1-9).

Subsequently, the second resist pattern 7 is subjected to an ashing process such as O2 plasma or is stripped by a mixed solution of sulfuric acid and hydrogen peroxide, and the formation of the modified insulation mask pattern section 41a is completed (ST1-10).

The conductive film 3 such as tungsten is subjected to appropriate anisotropic dry etching by use of a hard mask, which is composed of the insulation mask pattern section 41 and modified insulation mask pattern section 41a, and the wiring pattern 31 and elongated wiring pattern 31a are formed (ST1-11). Incidentally, the insulation mask pattern section 41 and modified insulation mask pattern section 41a may be disappeared or remained during the etching.

The above set of process steps enables the formation of elongated line wiring patterns which surpass the resolving power of the excimer lithography.

In addition, for example, the second insulating layer 8 of silicon oxide is formed thereon, and the hole pattern 102 reaching the substrate 1 is opened in the second insulating layer 8 to avoid the elongated wiring pattern 31a, and further the hole pattern 101 is opened in the second insulating layer 8 so as not to miss the other wiring pattern 31 (ST1-12). In this case, the elongated pattern 31a may be as narrow as possible, while the other wiring is as wide as possible.

Next, FIG. 3 is a plan view illustrating a process flow of a first specific example in accordance with the embodiment 1 of the present invention. In FIG. 3, reference numeral 7 designates a second resist pattern; 41 designates an insulation mask pattern; 41a designates a modified insulation mask pattern section; 101, 102 each designate a hole pattern; and 701 designates an opened section of the second resist pattern 7.

The operation will be next described below.

The insulation mask pattern 41 corresponding to ST1-7 of FIG. 2 is formed on the conductive film 3 (ST2-1), the second resist pattern 7 is formed with the opened section 701 in such a manner that the elongated pattern of the insulation mask pattern 41 is partially exposed (ST2-2). When this is subjected to certain isotropic etching, the wiring width of the pattern may be selectively shrunk in the corresponding opened section, thus effecting the formation of the modified insulation mask pattern section 41a where shaded areas have been removed from these original places (ST2-3).

After the second resist pattern 7 is removed by ashing and stripping processes, the conductive film 3 as a work film is subjected to anisotropic etching through the insulation mask pattern 41 and modified insulation mask pattern section 41a as a hard mask till the first insulating layer as a sub-layer is completely exposed. After the second insulating layer 8 is formed thereon with a predetermined thickness, the hole pattern 101 is formed at the wide pattern section of the insulation mask pattern 41 by way of photolithography (ST2-4). Here, when it is intended to form the hole patterns 102a on the two sides of the modified insulation mask pattern section 41a, it is possible to improve the design margins by widths corresponding to the aforementioned shaded areas.

Further, FIG. 4 is a plan view illustrating a process flow of a second specific example in accordance with the embodiment 1 of the present invention: the left side denotes a peripheral pattern region (A), and the right side denotes a memory cell pattern region (B). In FIG. 4, reference numeral 7 designates a second resist pattern; 41 designates an insulation mask pattern; 41a designates a modified insulation mask pattern section; and 101, 102 each designate a hole pattern.

The operation will be next described below.

The insulation mask pattern 41 corresponding to ST1-7 of FIG. 2 is formed on the conductive film 3 (ST3-1). The second resist pattern 7 is formed and covered over in the left peripheral circuit pattern region (A) of the insulation mask patterns 41, while the right memory cell pattern region (B) not covered by the second resist pattern 7. In this state, after certain isotropic etching is processed, the second resist pattern 7 is removed, thus effecting the modified insulation mask pattern section 41a in the memory cell pattern region (B) (ST3-2).

When the conductive mask 3 is subjected to desired etching through the insulation mask pattern 41 and modified insulation mask pattern section 41a as a hard mask, the wiring pattern 31a of the remaining or line pattern is created in the form of narrowing its wiring width in the right memory cell pattern region (B) (see ST1-11 of FIG. 2).

After the second insulating layer 8 is formed thereon with a desired thickness, the hole patterns 101, 102 are formed by way of photolithography and opened by anisotropic etching (ST3-3). As is apparent from this instance, the typical condition remains on the hole pattern 101, while the design margin is enlarged and improved on the hole pattern 102 by a shrunk width in the wiring width of the wiring pattern 31a.

Thus, it is effective in any semiconductor memory product that it is required to shrink selectively the wiring width only in a memory cell pattern region, while to widen the wiring width in connection with the adjacent holes in a peripheral circuit pattern region.

As described above, according to the embodiment 1, the insulation mask film 4 has an etching rate different from the conductive film 3 of the work film, and is selectively subjected to isotropic etching through the second resist pattern 7 as a mask. In this way, only the remaining pattern to be required may be shrunk, thereby achieving a desired pattern on the designs.

Embodiment 2

Figure 5:
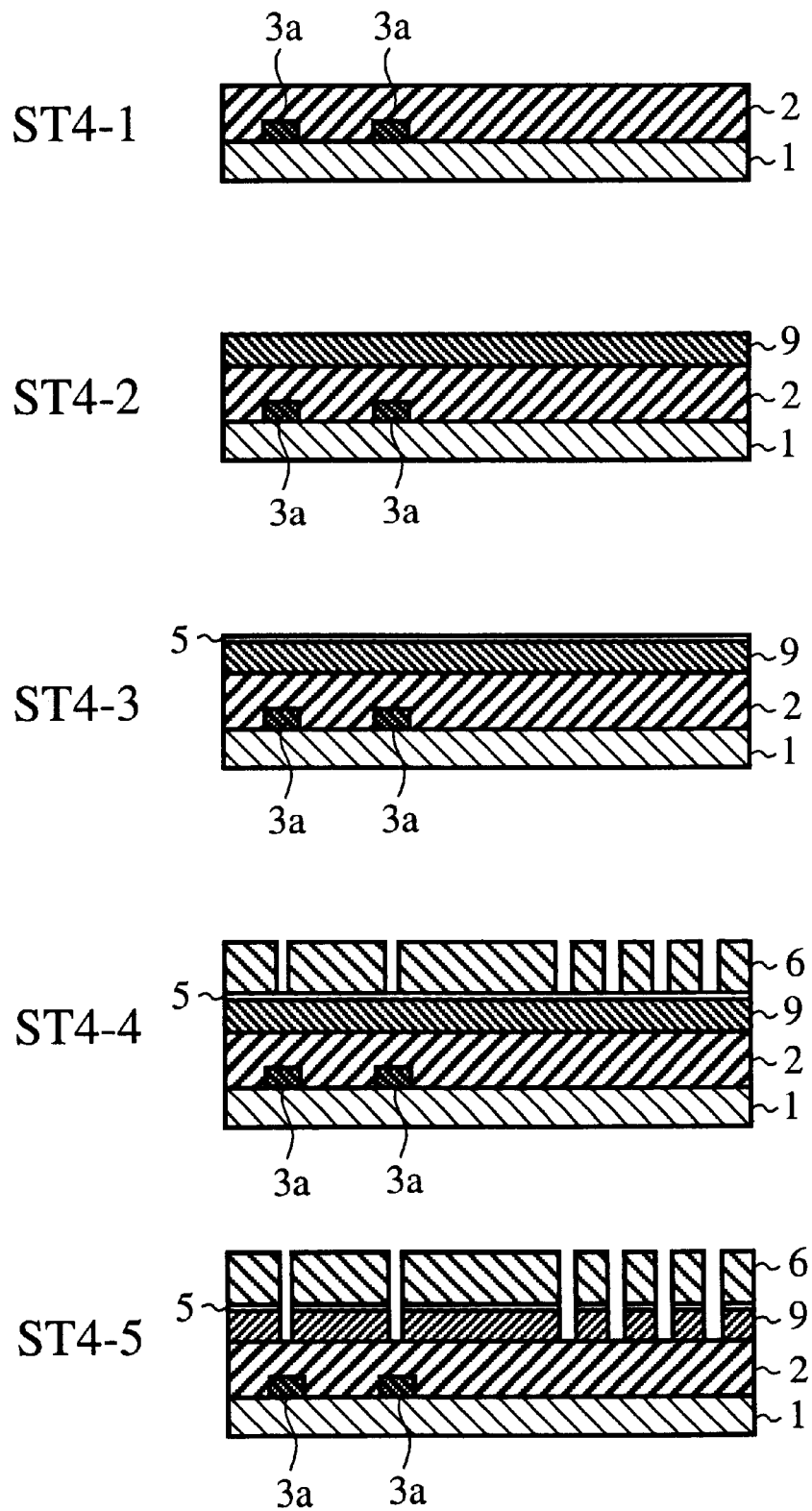
FIG. 5 is a process flow chart of a method of forming a fine pattern in accordance with an embodiment 2 of the present invention.
Figure 6:
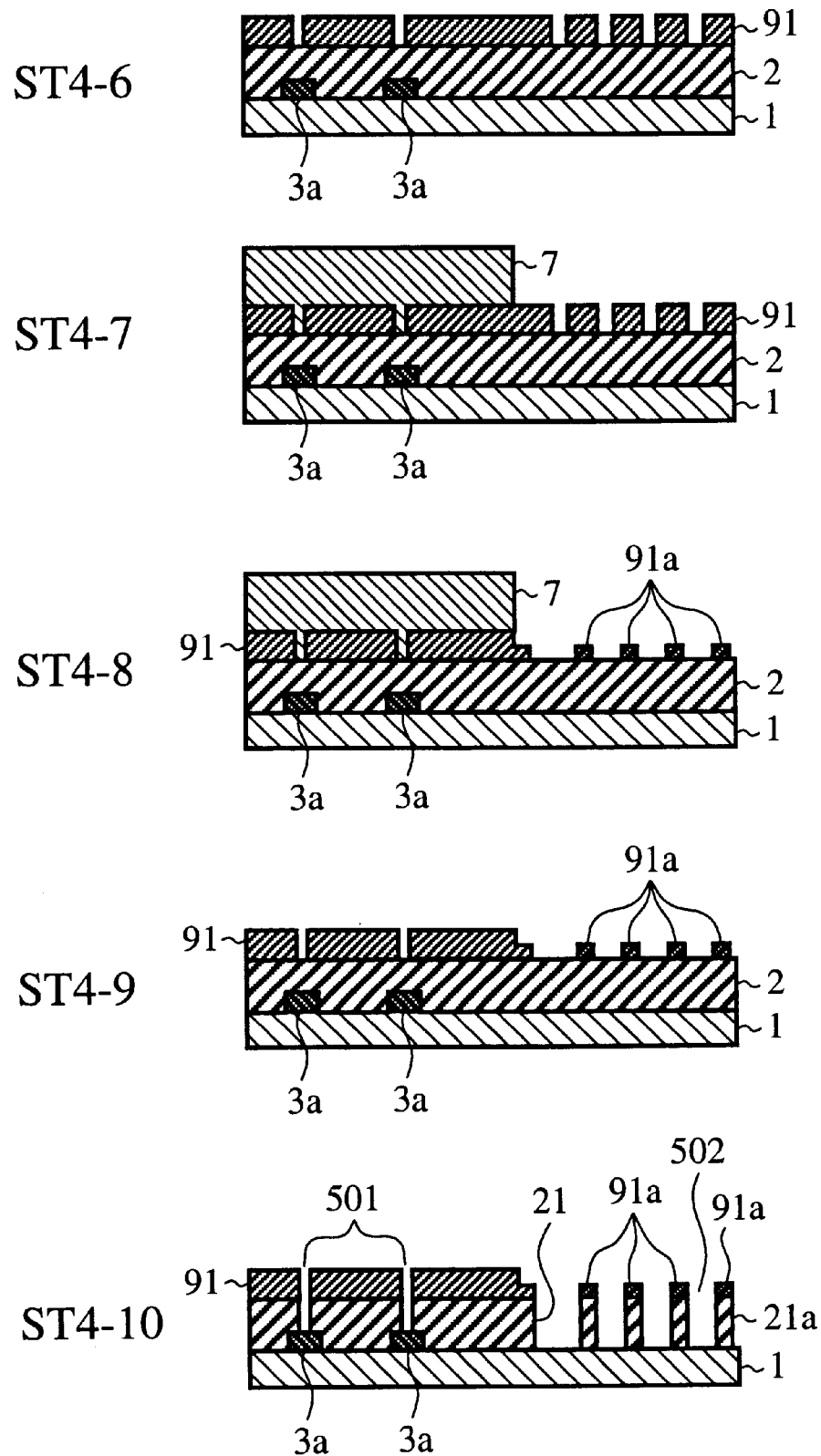
FIG. 6 is a process flow chart of a method of forming a fine pattern in accordance with the embodiment 2 of the present invention.
Figure 7:
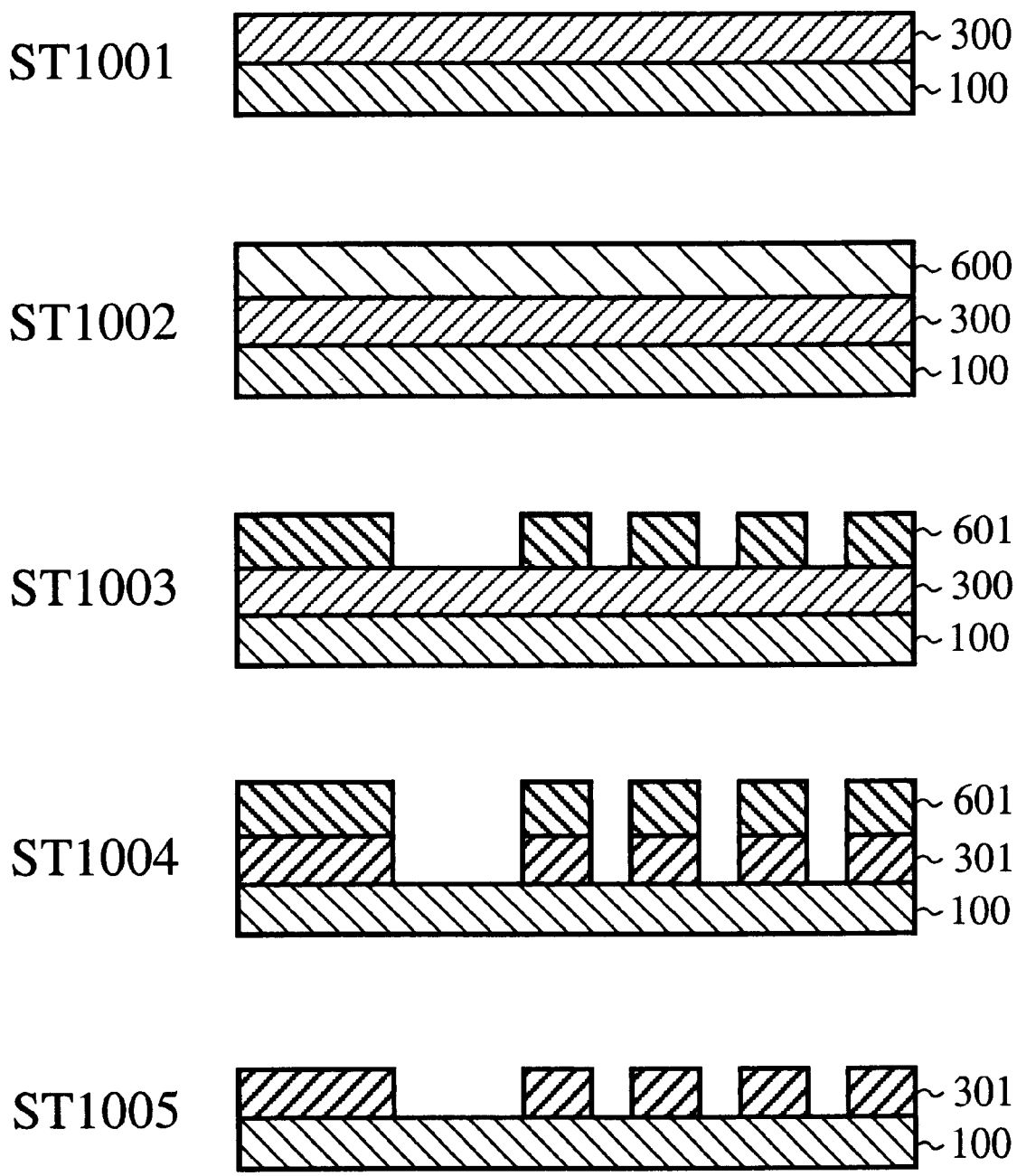
FIG. 7 is a process flow illustrating a conventional method of forming a fine pattern.
Figure 8:
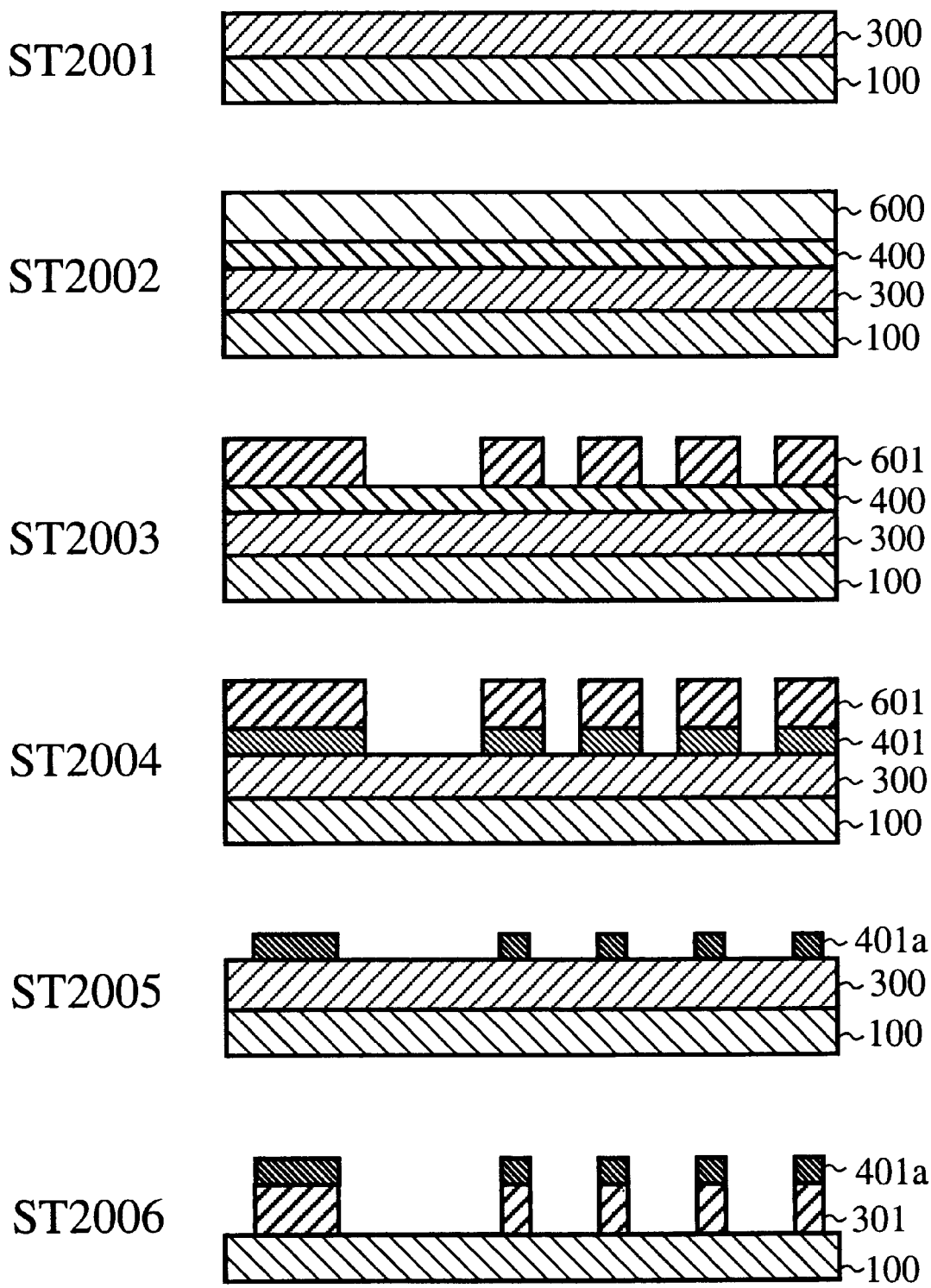
FIG. 8 is a process flow illustrating another method of forming a fine pattern.

FIGS. 5 and 6 are a process flow chart of a method of forming a fine pattern in accordance with an embodiment 2 of the present invention, and are applied on the formation of hole or groove patterns during manufacturing processes of a semiconductor device or liquid crystal device.

In FIGS. 5 and 6, reference numeral 1 designates a substrate; 2 designates a first insulating layer (work film) composed of either of silicon oxide and silicon nitride, or a two-layered film of them; 3a designates a lower wiring composed of a conductive film of at least one type of polysilicon, tungsten silicide, aluminum, and tungsten, or a multi-layered film of them; 9 designates a conductive mask film (hard mask) such as polysilicon which has a selectivity to silicon oxide, thus to be capable of serving as a mask for silicon oxide etching; 5 designates an organic antireflection film; 6 designates a first resist pattern; 91 designates a conductive mask pattern (hard mask pattern); 91a designates a modified conductive mask pattern section (hard mask pattern); 21 designates an insulation pattern; 21a designates an elongated insulation pattern; 501 designates a contact hole; and 502 designates an opened section.

The operation will be next described below.

First, the conductive mask film 9 such as polysilicon which has a high selectivity to silicon oxide and may serve as a mask for silicon oxide etching is formed e.g. with a thickness of 150 nm on the lower wiring 3a and the first insulating layer 2, where the former has been already processed and patterned on the substrate 1 and then the latter has been formed with a thickness of 500 nm (ST4-1, ST4-2).

By way of the Krypton-F (Kr—F) excimer laser lithography, the first resist pattern 6 having hole or groove patterns is formed thereon with a space dimension of 180 nm in the minimum dimension, which falls within a resolution limitation in the lithography. The first resist pattern 6 with another dimension is also formed on this patterning. Further, at the same time the organic antireflection film 5 having a thickness of 50 to 80 nm may be formed under the resist for an improvement of the lithography characteristics (ST4-3, ST4-4).

It should be noted that such a fine pattern preferably surpasses the resolution of the excimer lithography on the designs. For this reason, the conductive mask film 9 such as polysilicon is subjected to an anisotropic etching proceeding (ST4-5) since it has a high selectivity to silicon oxide to be capable of serving as a mask for silicon oxide etching when a fine space pattern formed by way of the excimer lithography is used as a mask.

Subsequently, the resist and organic antireflection film 5 are removed by way of an ashing processing with an O2 plasma and the like or a mixing solution of sulfuric acid and hydrogen peroxide, thus completing the formation of the conductive mask pattern 91 to reach the state of Step ST4-6 in FIG. 6. The desired second resist pattern 7 is formed with a thickness of 1000 nm byway of the G-line or I-line lithography of the hydrogen lamp (ST4-7).

Here, when the conductive mask film 9 is made of e.g. polysilicon, it is subjected to an isotropic etching of 30 to 50 nm with a chlorine gas or a SF6/O2-based gas mixture. Consequently, the space dimension of the polysilicon film 9 is enlarged by 60 to 100 nm only in the section not covered with the second resist pattern 7 (i.e., the line dimension is narrowed). In such a way, the modified conductive mask pattern section 91a is formed (ST4-8).

Then, the second resist pattern 7 is subjected to an ashing processing with a O2 plasma, or stripped with a mixing solution of sulfuric acid and hydrogen peroxide (ST4-9). The first insulating layer 2 of silicon oxide is subjected to an appropriate anisotropic dry etching through the conductive mask pattern 91 and modified conductive mask pattern section 91a as a hard mask, thereby forming the insulation patterns 21, 21a (ST4-10), and also completing the contact hole 501 and opened section 502 simultaneously.

Note that the hard mask of polysilicon may be disappeared or remained during this etching. The aforementioned set of processes enables the formation of patterns surpassing the resolving power of the excimer laser lithography.

In this case, since it is required that the contact hole 501 portion at Step ST4-10 in FIG. 6 never misses the lower wiring 3a already formed, the space dimension cannot be enlarged. On the other hand, though the line dimension of the modified conductive mask pattern section 91a at Step ST4-10 in FIG. 6 must be performed as narrow as possible. However, such a fine pattern formation may be achieved by the aforementioned method.

As described above, according to the embodiment 2, when the second resist pattern 7 is employed as a mask, the conductive mask film 9 selectively has a different etching rate from the first insulating film 2 of the work film and may serve as a hard mask to the work film during the etching. Thus, when the conductive mask film 9 is selectively subjected to isotropic etching through the second resist pattern 7 as a mask, only the line or left pattern in the required section may be shrunk, thereby achieving a desired pattern on the designs.

Further, when the aforementioned methods of forming a fine pattern are employed at the manufacturing steps of a variety of electronics devices such as semiconductor device and liquid crystal device, the design and process margins are enlarged surely to effect an improved production yield and further developments of new devices.

What is claimed is:

1. A method of forming a fine pattern comprising the steps of:

forming a work film to be processed on a substrate;

forming a hard mask film which has a different etching rate from said work film and serves as a mask to said work film during etching;

forming a first resist pattern on said hard mask film by lithography;

forming a hard mask pattern by etching a first section of said hard mask film which is not covered with said first resist pattern until the upper surface of said work film is exposed;

removing said first resist pattern;

forming a second resist pattern on said hard mask pattern by lithography;

etching a second section of said hard mask pattern which is not covered with said second resist pattern by isotropic etching, thereby forming a hard mask pattern modified portion;

removing said second resist pattern; and etching said work film through said hard mask pattern and hard mask pattern modified portion, which is partially subjected to the isotropic etching, serving as a mask.

2. The method of forming a fine pattern according to claim 1, wherein said work film is composed of a conductive film, while said hard mask film is composed of an insulating film.

3. The method of forming a fine pattern according to claim 2, wherein said conductive film is composed of at least one type of polysilicon, tungsten silicide, aluminum, and tungsten, or a multi-layered film thereof, while said insulating film is composed of either silicon oxide or silicon nitride, or a two-layered film thereof.

4. The method of forming a fine pattern according to claim 1, wherein said work film is composed of an insulating film, while said hard mask film is composed of a conductive film.

5. The method of forming a fine pattern according to claim 4, wherein said insulating film is composed of either silicon oxide or silicon nitride, or a two-layered film thereof, while said conductive film is composed of at least one type of polysilicon, tungsten silicide, aluminum, and tungsten, or a multi-layered film thereof.

6. The method of forming a fine pattern according to claim 1, wherein said isotropic etching is performed by wet etching.

7. The method of forming a fine pattern according to claim 1, further comprising a step of forming an antireflection film before said step of forming the first resist pattern.

8. A method of manufacturing a semiconductor device employing a method of forming a fine pattern according to claim 1.

9. A method of manufacturing a liquid crystal device employing a method of forming a fine pattern according to claim 1.

* * * * *